(12) United States Patent
Ahuja et al.

(10) Patent No.: US 9,142,482 B2
(45) Date of Patent: Sep. 22, 2015

(54) TRANSIENT THERMAL MANAGEMENT SYSTEMS FOR SEMICONDUCTOR DEVICES

(75) Inventors: Sandeep Ahuja, University Place, WA (US); Ioan Sauciuc, Phoenix, AZ (US); Susan F. Smith, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 13/977,402

(22) PCT Filed: Dec. 27, 2011

(86) PCT No.: PCT/US2011/067422
§ 371 (c)(1),
(2), (4) Date: Jun. 28, 2013

(87) PCT Pub. No.: WO2013/100913
PCT Pub. Date: Jul. 4, 2013

(65) Prior Publication Data
US 2013/0329358 A1    Dec. 12, 2013

(51) Int. Cl.
*H05K 7/20* (2006.01)
*H01L 23/473* (2006.01)
(Continued)

(52) U.S. Cl.
CPC .............. *H01L 23/473* (2013.01); *G06F 1/206* (2013.01); *H01L 23/34* (2013.01); *H01L 2924/0002* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ............... 361/676–678, 679.46–679.54, 361/688–723; 165/80.1–80.5, 104.33, 185; 174/15.1–15.3, 16.1–16.3, 547, 548; 257/712–722, E23.088
See application file for complete search history.

(56) References Cited

U.S. PATENT DOCUMENTS 6,519,955 B2 *  2/2003  Marsala .......................... 62/119
6,609,561 B2    8/2003  Sauciuc et al.
(Continued)

FOREIGN PATENT DOCUMENTS

WO     2013/100913 A1    7/2013

OTHER PUBLICATIONS

International Preliminary Report on Patentability received for International Application No. PCT/US2011/067422, mailed on Jul. 10, 2014, 9 pages.
(Continued)

*Primary Examiner* — Anthony Haughton
*Assistant Examiner* — Razmeen Gafur

(57) ABSTRACT

Thermal management systems for semiconductor devices are provided. Embodiments of the invention provide two or more liquid cooling subsystems that are each capable of providing active cooling to one or more semiconductor devices, such as packaged processors. In operation, a first liquid cooling subsystem can provide active cooling to the semiconductor device(s) while the second cooling subsystem is circulating a heat transfer fluid within its own subsystem. The second liquid cooling subsystem can be then switched into operation and provides active cooling to the semiconductor device(s) while the first cooling subsystem is circulating heat transfer fluid within its own subsystem. In alternate embodiments, the heat transfer fluid remains in the subsystem, but does not circulate within the subsystem when the subsystem is not providing cooling to the semiconductor device(s). The subsystems comprise heat dissipation units. The switching between cooling systems allows the semiconductor device(s) to be maintained at a lower operating temperature than if switching between cooling subsystems were not employed.

22 Claims, 4 Drawing Sheets

(51) Int. Cl.
*H01L 23/34* (2006.01)
*G06F 1/20* (2006.01)

(56) References Cited

U.S. PATENT DOCUMENTS

| | | | |
|---|---|---|---|
| 6,917,522 B1 | 7/2005 | Erturk et al. | |
| 6,942,018 B2 * | 9/2005 | Goodson et al. | 165/80.4 |
| 6,971,442 B2 | 12/2005 | Chrysler et al. | |
| 7,000,684 B2 * | 2/2006 | Kenny et al. | 165/80.4 |
| 7,243,705 B2 | 7/2007 | Boyd et al. | |
| 7,259,965 B2 | 8/2007 | Chang et al. | |
| 7,340,904 B2 | 3/2008 | Sauciuc et al. | |
| 7,380,409 B2 * | 6/2008 | Campbell et al. | 62/259.2 |
| 7,431,071 B2 * | 10/2008 | Wenger | 165/47 |
| 7,457,116 B2 | 11/2008 | Chrysler et al. | |
| 7,499,278 B2 | 3/2009 | Chrysler et al. | |
| 7,508,671 B2 | 3/2009 | Chrysler et al. | |
| 7,743,820 B2 | 6/2010 | Wei | |
| 7,751,189 B2 | 7/2010 | Ahuja et al. | |
| 7,870,893 B2 * | 1/2011 | Ouyang et al. | 165/288 |
| 7,886,816 B2 * | 2/2011 | Ouyang | 165/299 |
| 8,260,474 B2 | 9/2012 | Ahuja et al. | |
| 8,333,569 B2 | 12/2012 | Sauciuc et al. | |
| 8,538,598 B2 | 9/2013 | Steinbrecher et al. | |
| 2003/0011987 A1 * | 1/2003 | Chu et al. | 361/690 |
| 2005/0244280 A1 | 11/2005 | Malone et al. | |
| 2006/0028800 A1 | 2/2006 | Chrysler et al. | |
| 2006/0050483 A1 * | 3/2006 | Wilson et al. | 361/702 |
| 2006/0131003 A1 | 6/2006 | Chang et al. | |
| 2006/0278373 A1 * | 12/2006 | Hsu | 165/104.33 |
| 2007/0034354 A1 * | 2/2007 | Tung et al. | 165/80.4 |
| 2007/0133173 A1 * | 6/2007 | Hsiung et al. | 361/699 |
| 2007/0217147 A1 | 9/2007 | Chang et al. | |
| 2007/0227709 A1 * | 10/2007 | Upadhya et al. | 165/121 |
| 2007/0230116 A1 | 10/2007 | Boyd et al. | |
| 2007/0242438 A1 * | 10/2007 | Belits et al. | 361/700 |
| 2008/0212281 A1 * | 9/2008 | Kerner et al. | 361/701 |
| 2009/0084931 A1 | 4/2009 | Chrysler et al. | |
| 2010/0101765 A1 | 4/2010 | Campbell et al. | |
| 2010/0277865 A1 | 11/2010 | Goth et al. | |
| 2011/0109335 A1 | 5/2011 | Schroeder et al. | |
| 2011/0122583 A1 | 5/2011 | Lowry | 361/699 |
| 2011/0242760 A1 * | 10/2011 | Bott et al. | 361/699 |
| 2011/0249402 A1 * | 10/2011 | Hentschel et al. | 361/699 |
| 2011/0292600 A1 * | 12/2011 | Campbell et al. | 361/691 |
| 2011/0317367 A1 * | 12/2011 | Campbell et al. | 361/700 |
| 2013/0060399 A1 | 3/2013 | Ahuja et al. | |

OTHER PUBLICATIONS

International Search Report and Written Opinion received for International Application No. PCT/US2011/067422, mailed on Sep. 24, 2012, 12 pages.

* cited by examiner

US 9,142,482 B2

TRANSIENT THERMAL MANAGEMENT SYSTEMS FOR SEMICONDUCTOR DEVICES

FIELD OF THE INVENTION

The embodiments of the invention relate to integrated circuit devices, thermal management of integrated circuit devices, liquid cooling, and transient cooling devices and methods.

BACKGROUND INFORMATION

Integrated circuit (IC) chip performance improvements and size reductions place increasing demands on the materials and techniques used for packaging and assembly of the resultant IC chips. In general, an integrated circuit chip is also known as a microchip, a silicon chip, a semiconductor chip, a chip, or a die. IC chips are found in a variety of common devices, such as the microprocessors in computers, cars, televisions, CD players, smart phones, and cellular phones. A plurality of IC chips can be built on a semiconductor wafer (a thin silicon disk, having a diameter, for example, of 300 mm) and after processing the wafer is diced apart to create individual IC chips (or dies). After manufacture, the IC chip is typically packaged and provided with thermal management solutions that take into account the operating environment provided by the device in which the IC chip will reside. As semiconductor chips trend toward higher bandwidth performance and users desire smaller form factors, the packaging of the semiconductor chips must meet size, thermal management, power delivery, and integration challenges.

DETAILED DESCRIPTION OF THE INVENTION

Embodiments of the invention provide thermal management systems for integrated circuit (IC) devices. Without adequate thermal management, many semiconductor devices are capable of producing enough heat during operation to cause device failure. It typically takes about 100 seconds for a processor, for example, to reach its steady state temperature. Due to the thermal capacitance of the materials a processor typically is packaged with which include, for example, thermal plates and heat dissipaters, it takes time for the temperature of the packaged processor system to reach a steady state value. Embodiments of the invention provide two or more liquid cooling subsystems that are each capable of providing active cooling to one or more semiconductor devices, such as a packaged processor. In operation, a first liquid cooling subsystem provides active cooling to the semiconductor device(s). During operation of the first liquid cooling subsystem, the temperature of this subsystem is rising. In embodiments of the invention, once at least one of the one or more semiconductor device(s) reaches a predetermined temperature, the second liquid cooling subsystem is switched into operation and provides active cooling to the semiconductor device(s). Because the second liquid cooling subsystem is at a lower temperature than the first subsystem at the time of switching, the temperature of the semiconductor device(s) is reduced. The first liquid cooling subsystem dissipates the stored heat while the second liquid cooling subsystem operates to cool the semiconductor device(s). Once the semiconductor device(s) reach a predetermined temperature, the first liquid cooling subsystem is switched into operation replacing the second subsystem. The switching between cooling subsystems allows the semiconductor device(s) to be maintained at a lower operating temperature than if switching between cooling subsystems were not employed. Although a processor is used as an example, embodiments of the invention are useful in any semiconductor device(s) in which thermal management is desired.

Figure 1:
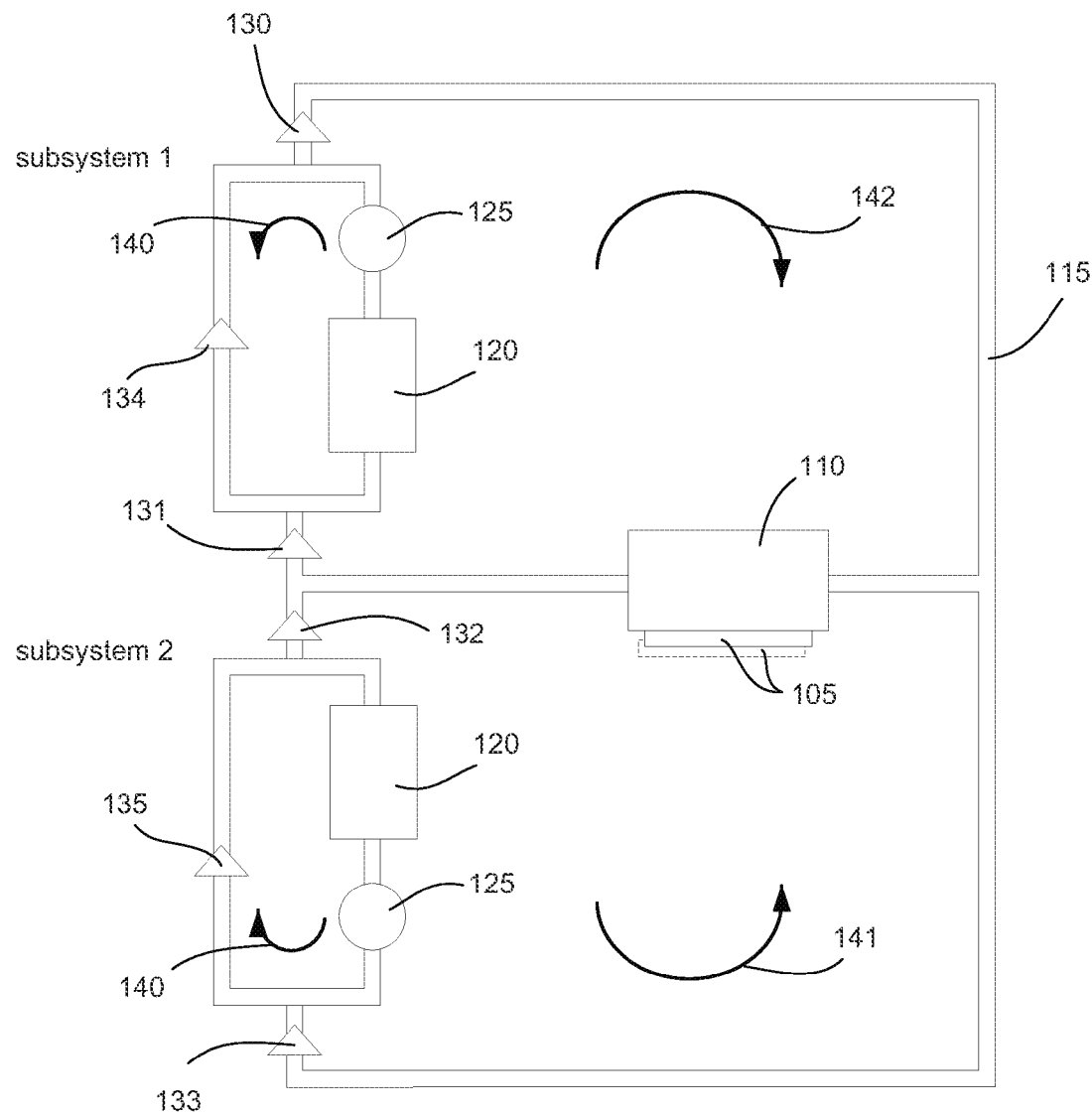
FIG. 1 is a schematic diagram illustrating a semiconductor device cooling system.

FIG. 1 illustrates a semiconductor device cooling system comprising two cooling subsystems. Cooling systems comprising other numbers of cooling subsystems are also possible, such as, for example, three, four, or more cooling subsystems. In FIG. 1, one or more semiconductor device(s) 105 is/are thermally associated with a thermal transfer unit 110 so that heat produced by the one or more semiconductor device(s) 105 is capable of being transferred to the thermal transfer unit 110. Thermally associated with means capable of exchanging heat with. The thermal association can occur through direct physical contact or through coupling through an intervening medium, such as package materials associated with the semiconductor device, additional thermal transfer units, and/or thermal interface materials. A thermal interface material is a material that is capable of conducting heat, such as for example, a phase change material, a ceramic-polymer composite, a metal-polymer composite, or a graphite-polymer composite, where a polymer can be a grease, a gel, an elastomer, or a thermosetting plastic. Examples of thermal interface materials include elastomers, greases, and gels comprising silver filler particles, graphite filled silicone or acrylic, ceramic particle filled silicone or acrylic. Other intervening mediums and thermal interface materials are also possible.

The thermal transfer unit 110 can comprise one or more channels (not shown) through which a liquid can pass, The one or more channels can be microchannels. The thermal transfer unit 110 can be, for example, a thermal cold plate or heat sink. A heat transfer fluid is capable of entering and exiting the thermal transfer unit 110 from a liquid inlet and a liquid outlet region, respectively. Fluid conduits 115 are operably coupled to an inlet and an outlet region for thermal transfer unit 110 and are capable of transferring a fluid into and out of thermal transfer unit 110. Thermal transfer unit 110 can also optionally have other associated thermal management elements, such as, for example, fins, channels, microchannels, heat pipes, pipes, tubes, tube plates, aluminum blocks, foamed graphite, manifolds, and/or heat exchangers. Heat exchangers include, for example, shell-and-tube heat exchangers, plate-fin heat exchangers, and Cu tubes swagged in an aluminum block. Fluid conduits 115 can be channels, microchannels, pipes, tubing, or a combination thereof.

A first and a second cooling subsystems (labeled "subsystem 1" and "subsystem 2" in FIG. 1) are each comprised of a heat dissipation unit 120 and a fluid pump 125. The heat dissipation unit 120 has one or more channels (not shown) through which a fluid can enter and exit the heat dissipation unit 120 and fluid conduits 115 are operably coupled to an inlet and outlet region for the heat dissipation unit 120 so that liquid can be transferred from the fluid conduits 115 into and out of the heat dissipation unit 120. The fluid conduits 115 are formed in a loop so that in operation when valves 130 and 131 (or valves 132 and 133 for subsystem 2) are closed and pump 125 is operating, a fluid in the fluid conduits 115 is transferred around the subsystem loop and into and out of the channels of the heat dissipation unit 120. Arrows 140 show an optional direction of fluid flow in the subsystems. Fluid flow in subsystems 1 and 2 in the opposite direction of that illustrated by arrows 140 can also be implemented. The heat dissipation unit 120 also optionally comprises fins, channels, microchannels, heat pipes, pipes, tubes, tube plates, aluminum blocks, foamed graphite, manifolds, heat exchangers (such as, shell-and-tube, plate-fin, Cu tubes swagged in Al block, for example), fans, blowers, and/or other heat dissipating elements, and/or thermally associated reservoirs capable of containing heat transfer fluid. Optional associated reservoirs have inlet and outlet ports that allow the heat transfer fluid from the system to flow into and out of the reservoir. Exemplary pumps 125 include centrifugal (radial, axial, mixed flow), positive displacement (reciprocating-type, rotating-type), magnetic, and piezo pumps. Other types of pumps are also possible.

When the system of FIG. 1 is in operation, either subsystem 1 or subsystem 2 is off line and moving heat transfer fluid around the subsystem loop. For example, subsystem 1 is circulating fluid around the subsystem loop and valves 130 and 131 are closed and valve 134 is open. Subsystem 2 is circulating heat transfer fluid through the thermal transfer unit 110 and valves 132 and 133 are open and valve 135 is closed. An arrow 141 indicates a direction of fluid flow during subsystem 2 operation. Fluid flow in the opposite direction can also be implemented. The system of FIG. 1 also comprises logic and circuitry (not shown) for operating subsystems 1 and 2 in response to temperature measurements associated with semiconductor chip(s) 105 and/or as a result of a software implemented routine. Some semiconductor devices, such as, for example, processors, memory chips, and chipsets can comprise temperature sensors that are capable of outputting temperature data. Temperature sensors can also include thermocouples, thermistors, and thermal diodes. Optional temperatures sensors (not shown) are in thermal contact with the semiconductor chip(s) 105, the heat transfer fluid, and/or the heat transfer unit 110 and are capable of providing temperature data to the logic for operating subsystems 1 and 2. Either in response to one or more detected temperature setpoints or as a result of a software implemented routine, subsystem 2 is taken off line and subsystem 1 is opened to the main system for providing cooling to semiconductor chip(s) 105. Subsystem 2 is taken off line by closing valves 132 and 133 and opening valve 135. Subsystem 1 is opened to the main system by opening valves 130 and 131 and closing valve 134. An arrow 142 illustrates the direction of flow for heat transfer fluid through the thermal transfer unit 110. The opposite direction for fluid flow is also possible. While off line subsystem 2 circulates heat transfer fluid through heat dissipation region 120. Either in response to one or more detected temperature setpoints and/or as a result of a software implemented routine, subsystem 1 is taken off line and subsystem 2 is opened to the heat transfer unit 110. The process of switching between subsystems is repeated a plurality of times while the semiconductor device is operating.

Figure 2:
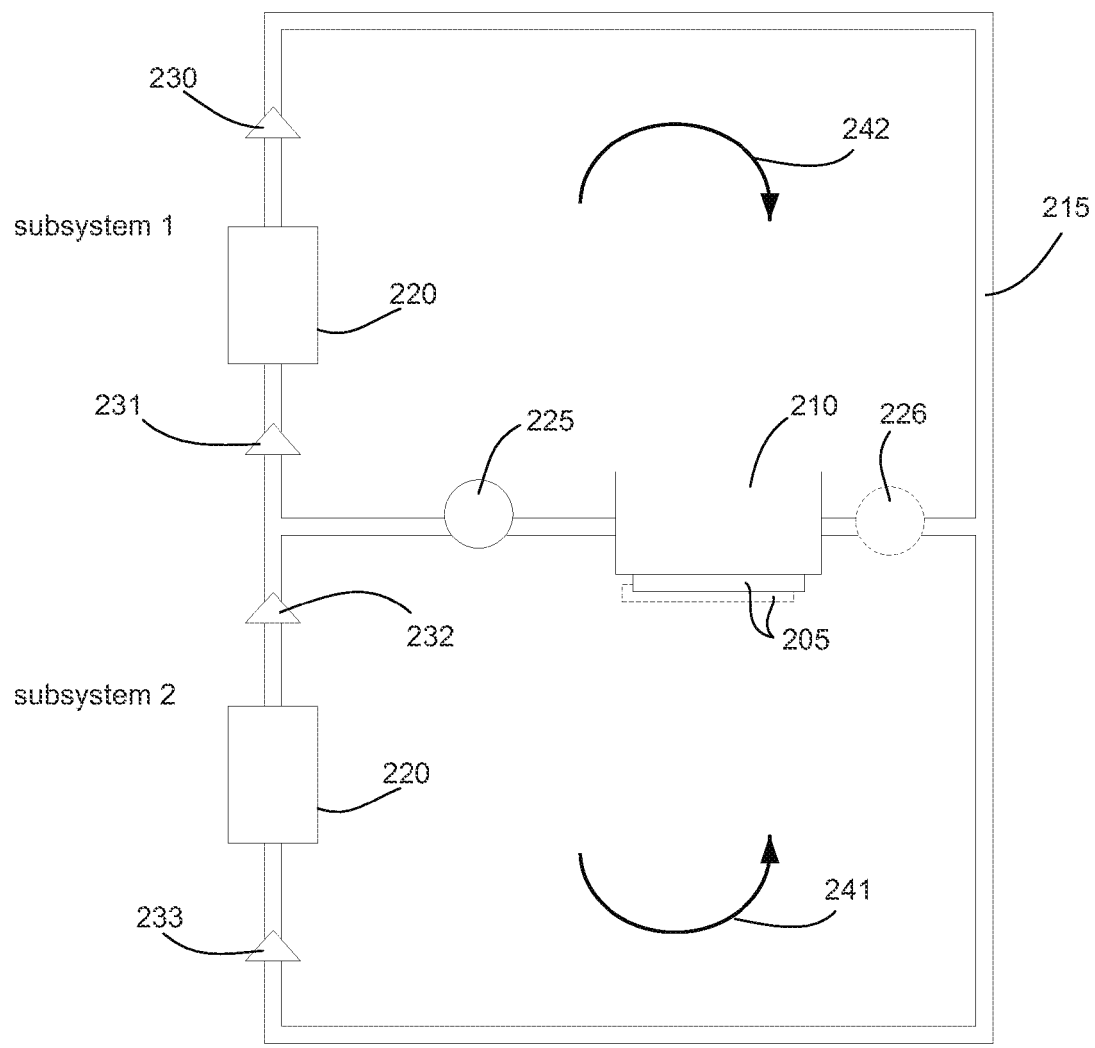
FIG. 2 is a schematic diagram illustrating an additional semiconductor device cooling system.

FIG. 2 illustrates a further semiconductor device cooling system comprising two cooling subsystems. Cooling systems comprising other numbers of cooling subsystems are also possible, such as, for example, three, four, or more cooling subsystems. In FIG. 2, one or more semiconductor device(s) 205 is/are thermally associated with a thermal transfer unit 210 so that heat produced by the semiconductor device(s) 205 is capable of being transferred to the thermal transfer unit 210. Thermally associated with means capable of exchanging heat with. The thermal association can occur through direct physical contact or through coupling through an intervening medium that is capable of transferring heat, such as package materials associated with the semiconductor device, additional thermal transfer units, and/or thermal interface materials. A thermal interface material is a material that is capable of conducting heat, such as for example, a phase change material, a ceramic-polymer composite, a metal-polymer composite, or a graphite-polymer composite, where a polymer can be a grease, a gel, an elastomer, or a thermosetting plastic. Examples of thermal interface materials include elastomers, greases, and gels comprising silver filler particles, graphite filled silicone or acrylic, ceramic particle filled silicone or acrylic. Other intervening mediums and thermal transfer materials are also possible.

Thermal transfer unit 210 can comprise one or more channels (not shown) through which a liquid can pass. The one or more channels can be microchannels. The thermal transfer unit 210 can be, for example, a thermal cold plate or heat sink. A heat transfer fluid is capable of entering and exiting the thermal transfer unit 210 from a liquid inlet and a liquid outlet region, respectively. Fluid conduits 215 are operably coupled to an inlet and an outlet region for thermal transfer unit 210 and capable of transferring a fluid into and out of thermal transfer unit 210. Thermal transfer unit 210 can also optionally have other associated thermal management elements, such as, for example, fins, channels, microchannels, pipes, tubes, tube plates, aluminum blocks, foamed graphite, manifolds, and/or heat exchangers. Heat exchangers include, for example, shell-and-tube heat exchangers, plate-fin heat exchangers, and copper tubes swagged in aluminum block. Fluid conduits 215 can be channels, microchannels, pipes, tubing, or a combination thereof.

A first and a second cooling subsystems (labeled "subsystem 1" and "subsystem 2" in FIG. 2) are each comprised of a heat dissipation region 220. The heat dissipation units 220 have one or more channels (not shown) through which a fluid can enter and exit the heat dissipation unit 220 and fluid conduits 215 are operably coupled to an inlet and outlet region for the heat dissipation unit 220 so that liquid can be transferred from the fluid conduits 215 into and out of the heat dissipation unit 220 via the fluid conduits 215. Fluid flow in subsystems 1 and 2 in the opposite direction of that illustrated by arrows 240 can also be implemented. The heat dissipation unit 220 also optionally comprises fins, channels, microchannels, pipes, tubes, tube plates, aluminum blocks, foamed graphite, manifolds, heat exchangers (such as, shell-and-tube, plate-fin, copper tubes swagged in aluminum block for example), fans, blowers, or other heat dissipating elements, and/or thermally associated reservoirs capable of containing heat transfer fluid. Optional associated reservoirs have inlet and outlet ports that allow the heat transfer fluid from the system to flow into and out of the reservoir.

A pump 225 moves heat transfer fluid through fluid conduits 215. An optional location 226 for the pump 225 is shown as a circle with at dashed line exterior. Exemplary pumps 225 include centrifugal (radial, axial, mixed flow), positive displacement (reciprocating-type, rotating-type) magnetic, and piezo pumps. Other pump types are also possible.

When the system of FIG. 2 is in operation, either subsystem 1 or subsystem 2 is in the loop around which heat transfer fluid is moving. For example, subsystem 1 is off line and valves 230 and 231 are closed. Subsystem 2 is circulating heat transfer fluid through the thermal transfer unit 210 and valves 232 and 233 are open. An arrow 241 indicates the direction of fluid flow during subsystem 2 operation. The opposite direction of fluid flow can also be implemented. The system of FIG. 2 also comprises logic and circuitry (not shown) for operating subsystems 1 and 2 in response to temperature measurements associated with semiconductor chip(s) 205 and/or as a result of a software implemented routine. Some semiconductor devices, such as processors, memory chips, and chipsets, for example, can comprise temperature sensors that are capable of outputting temperature data. Temperature sensors can also include thermocouples, thermistors, and thermal diodes. Optional temperature sensors (not shown) are in thermal contact with the semiconductor chip(s) 205, the heat transfer fluid, and/or the heat transfer unit 210 and are capable of providing temperature data to the logic for operating subsystems 1 and 2. Either in response to one or more detected temperature setpoints or as a result of a software implemented routine, subsystem 2 is taken off line and subsystem 1 provides cooling to the semiconductor chip(s) 205 by circulating thermal fluid through the thermal transfer unit 210. Subsystem 2 is taken off line by closing valves 232 and 233. Subsystem 1 is opened to circulate fluid to the thermal transfer unit 210 by opening valves 230 and 231. An arrow 242 illustrates the direction of flow for heat transfer fluid through the thermal transfer unit 210. The opposite direction for fluid flow is also possible. Either in response to one or more detected temperature setpoints and/or as a result of a software implemented routine, subsystem 1 is taken off line and subsystem 2 is opened to the thermal transfer unit 210. The process of switching between subsystems is repeated a plurality of times while the semiconductor device is operating. In embodiments of the invention, the thermal transfer fluid volume is mostly located in the heat exchangers 220 and significantly less thermal transfer fluid volume is in the ducting 215.

Other shapes, designs, configurations and/or relative orientations of the components of the first and second subsystems and semiconductor device cooling loops are also possible.

Figure 3:
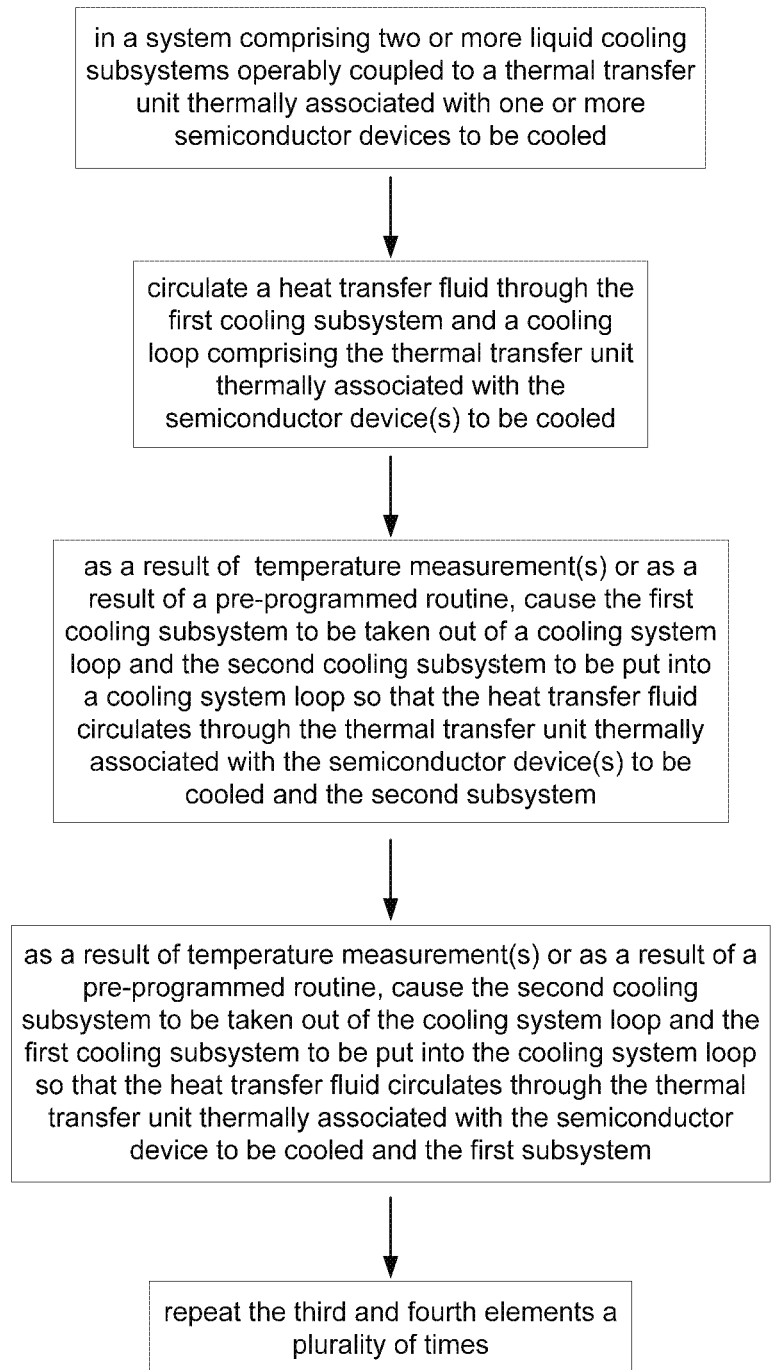
FIG. 3 is a flow chart describing a method for cooling a semiconductor device.

FIG. 3 provides a flow diagram describing a method for thermally managing a semiconductor device using two or more cooling subsystems. In FIG. 3, a system comprising two or more cooling subsystems is provided. The cooling subsystems can be the cooling subsystems according to FIGS. 1 and 2. The liquid cooling subsystems are coupled through fluid conduits to a thermal transfer unit that is thermally associated with one or more semiconductor device(s) to be cooled. The thermal transfer unit comprises one or more channels through which the heat transfer fluid can pass. The heat transfer fluid is circulated through the fluid conduits in a first loop that causes the heat transfer fluid to pass through the thermal transfer unit and the first cooling subsystem. A module is provided that comprises a logic unit for switching between the first and the second subsystem based on, for example, the known operational characteristics of the semiconductor device(s) (and the heat management characteristics of the associated cooling system) and/or one or more detected temperatures for the semiconductor device(s) or a detected temperature difference between the thermal transfer fluid in the first and the second subsystems that exceeds a pre-characterized threshold value. The modules can be implemented as software, hardware, firmware, or a combination thereof. The module causes the first fluid subsystem to be taken off line and the second fluid subsystem to be switched into the cooling loop for the semiconductor device(s). The heat transfer fluid is circulated through the fluid conduits in a second loop that causes the heat transfer fluid to pass through the thermal transfer unit and the second cooling subsystem. This process of switching between a first and second cooling subsystem is repeated a plurality of times. Optionally, three or more cooling subsystems are provided and the subsystems are switched on and off line in a defined pattern and in a manner similar to when two cooling subsystems are used in order to provide cooling to the semiconductor device(s).

A heat transfer fluid is a material that is a fluid at the operating temperatures of the system. The heat transfer fluid can be, for example, potassium formate, or a glycol, such as propylene glycol, water or mixture of water and a glycol, or a mixture of water and an antifreeze agent. Other heat transfer fluids are also possible.

The semiconductor chips discussed herein can be any type of integrated circuit device, such as, logic chips, processors (single core or multi-core), a memory controller hubs, memory chips, analog chips, digital chips, graphics chips, MEMS devices, and/or chipsets. For example, the semiconductor chip can be plurality of semiconductor chips packaged together, such as, for example, one or more stacked memory/logic unit(s) or a one or more stacked memory chip units. Other exemplary chips include microprocessors, graphics processors, signal processors, network processors, system-on-chip (SoC) having multiple functional units (such as, one or more processing units, graphics units, communications units, signal processing units, security units), wireless communication chips, and/or wireless communications chipsets. The term "processor" can refer to any device or portion of a device that processes electronic data from registers and/or memory to transform that electronic data into other electronic data that may be stored in registers and/or memory. A memory chip can be, for example, static random access memory (SRAM) chip, and/or a dynamic random access memory (DRAM) chip, and/or a non-volatile memory chip. Wireless communication chips enable wireless communications for the transfer of data to and from a computing device. The term does not imply that the associated devices do not contain any wires, although in some embodiments they might not. A wireless communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. A first wireless communication chip may be dedicated to shorter range wireless communications such as Wi-Fi and Bluetooth and a second wireless communication chip may be dedicated to longer range wireless communications such as GPS, EDGE, GPRS, CDMA, WiMAX, LTE, Ev-DO, and others, and the first and the second communication chips may form a communications chipset. In alternate embodiments of the invention, the semiconductor chip can be a silicon photonics device, such as a photodetector chip or a laser chip.

Figure 4:
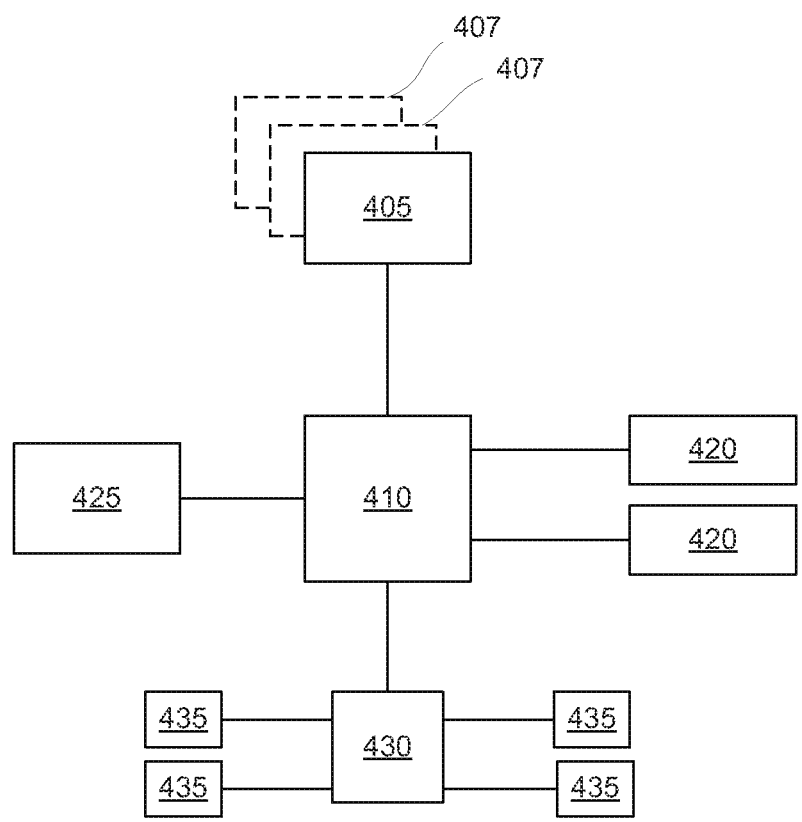
FIG. 4 diagrams an exemplary computing system in which semiconductor device cooling systems can be employed.

FIG. 4 illustrates an exemplary computing system in which embodiments of the invention, such as those described with respect to FIGS. 1-3, can be employed as heat management systems for processors, other semiconductor chips, and/or Chipsets in the system. Embodiments of the invention are not limited, however, to deployment in a specific type of computing system. In FIG. 4, a computing system comprises a processor 405 operably coupled to a memory controller hub 410. The computing system can optionally include additional processors 407 denoted in FIG. 4 with dashed lines. In the computing system of FIG. 4, the memory controller hub 410 can be coupled to a memory 420, to a graphics chip 425, and to an input/output controller chip 430. The memory can be, for example, a dynamic random access memory (DRAM). The memory controller hub 410 and graphics chip 420 can be a chipset or a portion of a chipset. The graphics chip 425 can be coupled to a display (not shown), such as a flat panel display, a monitor, or other type of display screen. The input/output controller chip 430 is connected to input/output devices 435. Input/output devices 435 include, for example, USB (universal serial bus), USB2, SATA (serial advanced technology attachment), audio, PCI (peripheral component interconnect), and PCI express devices. Other configurations and elements are, of course, possible for a computing system.

Cooling systems according to embodiments of the invention can optionally be mounted on a mainboard assembly for integration into a computing system. In general, a mainboard may comprise any suitable type of circuit board or other substrate capable of providing electrical communication between one or more of the various components of the computing system disposed on the board and between the various components disposed on the board and other connected remote elements of the computing system.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. Various additional layers and/or structures may be included and/or described features may be omitted in other embodiments.

We claim:

1. A heat management system comprising,
   one or more semiconductor devices,
   a thermal transfer unit thermally associated with the one or more semiconductor devices wherein the thermal transfer unit comprises one or more channels through which a liquid can pass,
   a first cooling subsystem wherein the first cooling subsystem comprises a pump, a heat dissipation unit, and a first subsystem fluid conduit loop, wherein the pump is capable of circulating a fluid around the first subsystem fluid conduit loop, wherein the heat dissipation unit comprises one or more channels through which a fluid can pass, and wherein the one or more channels of the heat dissipation unit are part of the first subsystem fluid conduit loop,
   a second cooling subsystem wherein the second cooling subsystem comprises a pump, a heat dissipation unit, and a second subsystem fluid conduit loop, wherein the pump is capable of circulating a fluid around the second subsystem fluid conduit loop, wherein the heat dissipation unit comprises one or more channels through which a fluid can pass, and wherein the one or more channels of the heat dissipation unit are part of the second subsystem fluid conduit loop,
   a first fluid conduit loop capable of receiving fluid from the first cooling subsystem and returning fluid to the first fluid subsystem wherein the one or more channels of the thermal transfer unit are part of the first fluid conduit loop, wherein first cooling subsystem pump is capable of circulating fluid through the first fluid conduit loop,
   a second fluid conduit loop capable of receiving fluid from the second cooling subsystem and returning fluid to the second fluid subsystem wherein the one or more channels of the thermal transfer unit are part of the second fluid conduit loop, wherein second cooling subsystem pump is capable of circulating fluid through the second fluid conduit loop, and
   at least one first valve disposed in the first fluid conduit loop and at least one second valve disposed in the second fluid conduit loop, wherein the at least one first valve is capable of closing off the first cooling subsystem from the first fluid conduit loop and the at least one second valve is capable of closing off the second cooling subsystem from the second fluid conduit loop.

2. The heat management system of claim 1 wherein the first cooling subsystem heat dissipation unit comprises a plurality of fins.

3. The heat management system of claim 1 also comprising logic for switching between a first state of the heat management system wherein the first cooling subsystem is open to the first fluid conduit loop, a heat transfer fluid is circulating in the first fluid conduit loop, and the second cooling subsystem is closed to the second fluid conduit loop, and a second state of the heat management system wherein the second cooling subsystem is open to the second fluid conduit loop, a heat transfer fluid is circulating in the second fluid conduit loop, and the first cooling subsystem is closed to the second fluid conduit loop.

4. The heat management system of claim 3 wherein the logic switches between the first state and the second state of the heat management system based on the temperature of at least one of the one or more semiconductor devices or the thermal transfer unit.

5. The heat management system of claim 3 wherein the logic switches between the first state and the second state of the heat management system based on a temperature difference between the heat transfer fluid in the first cooling subsystem and the heat transfer fluid in the second cooling subsystem that exceeds a pre-characterized threshold value.

6. The heat management system of claim 3 wherein the logic switches between the first state and the second state of the heat management system based on known characteristics of at least one of the one or more semiconductor devices.

7. A heat management system comprising,
   one or more semiconductor devices,
   a thermal transfer unit thermally associated with the one or more semiconductor devices wherein the thermal transfer unit comprises one or more channels through which a liquid can pass,
   a first cooling subsystem wherein the first cooling subsystem comprises a heat dissipation unit, wherein the heat dissipation unit comprises one or more channels through which a fluid can pass,
   a second cooling subsystem wherein the second cooling subsystem comprises a heat dissipation unit, wherein the heat dissipation unit comprises one or more channels through which a fluid can pass,
   a first fluid conduit loop capable of receiving fluid from the first cooling subsystem and returning fluid to the first fluid subsystem wherein the one or more channels of the thermal transfer unit are part of the first fluid conduit loop,
   a second fluid conduit loop capable of receiving fluid from the second cooling subsystem and returning fluid to the second fluid subsystem wherein the one or more channels of the thermal transfer unit are part of the second fluid conduit loop,
   a pump capable of circulating fluid through the first and the second fluid conduit loop, and
   at least one first valve disposed in the first fluid conduit loop and at least one second valve disposed in the second fluid conduit loop, wherein the at least one first valve is capable of closing off the first cooling subsystem from the first fluid conduit loop and the at least one second valve is capable of closing off the second cooling subsystem from the second fluid conduit loop.

8. The device of claim 7 wherein the first cooling subsystem heat dissipation unit also comprises a plurality of fins.

9. The heat management system of claim 7 also comprising logic for switching between a first state of the heat management system wherein the first cooling subsystem is open to the first fluid conduit loop, a heat transfer fluid is circulating in the first fluid conduit loop, and the second cooling subsystem is closed to the second fluid conduit loop, and a second state of the heat management system wherein the second cooling subsystem is open to the second fluid conduit loop, a heat transfer fluid is circulating in the second fluid conduit loop, and the first cooling subsystem is closed to the second fluid conduit loop.

10. The heat management system of claim 9 wherein the logic switches between the first state and the second state of the heat management system based on the temperature of at least one of the one or more semiconductor devices or the thermal transfer unit.

11. The heat management system of claim 9 wherein the logic switches between the first state and the second state of the heat management system based on a temperature difference between the heat transfer fluid in the first cooling subsystem and the heat transfer fluid the second cooling subsystem that exceeds a pre-characterized threshold value.

12. The heat management system of claim 9 wherein the logic switches between the first state and the second state of the heat management system based on known characteristics of at least one of the one or more semiconductor devices.

13. A method for cooling a semiconductor device comprising:
providing a thermal management system comprising a first and a second cooling subsystems operably coupled to a thermal transfer unit thermally associated with the semiconductor device wherein the first and the second cooling subsystems are each capable of passing a fluid through the thermal transfer unit,
cooling the semiconductor device by switching the thermal management system between a first state in which a fluid is circulating through the thermal transfer unit and the first cooling subsystem wherein the fluid from the second cooling subsystem is not circulating through the thermal transfer unit, and a second state in which the fluid is circulating through the thermal transfer unit and the second cooling subsystem wherein the fluid from the first cooling subsystem is not circulating through the thermal transfer unit, and
wherein logic switches the thermal management system between the first state and the second state.

14. The method of claim 13 wherein the logic switches between the first state and the second state of the heat management system based on the temperature of the semiconductor device or the thermal transfer unit.

15. The method of claim 13 wherein the logic switches between the first state and the second state of the heat management system based on a temperature difference between a fluid in the first cooling subsystem and a fluid the second cooling subsystem that exceeds a pre-characterized threshold value.

16. The method of claim 13 wherein the logic switches between the first state and the second state of the heat management system based on known characteristics of the semiconductor device.

17. A computing device comprising:
a motherboard,
a processor mounted on the motherboard, and
a heat management system thermally coupled to the processor through a thermal transfer unit that is in thermal contact with the processor, wherein the thermal transfer unit comprises one or more channels through which a liquid can pass and wherein the heat management system comprises:
a first cooling subsystem wherein the first cooling subsystem comprises a pump, a heat dissipation unit, and a first subsystem fluid conduit loop, wherein the pump is capable of circulating a fluid around the first subsystem fluid conduit loop, wherein the heat dissipation unit comprises one or more channels through which a fluid can pass, and wherein the one or more channels of the heat dissipation unit are part of the first subsystem fluid conduit loop,
a second cooling subsystem wherein the second cooling subsystem comprises a pump, a heat dissipation unit, and a second subsystem fluid conduit loop, wherein the pump is capable of circulating a fluid around the second subsystem fluid conduit loop, wherein the heat dissipation unit comprises one or more channels through which a fluid can pass, and wherein the one or more channels of the heat dissipation unit are part of the second subsystem fluid conduit loop,
a first fluid conduit loop capable of receiving fluid from the first cooling subsystem and returning fluid to the first fluid subsystem wherein the one or more channels of the thermal transfer unit are part of the first fluid conduit loop, wherein first cooling subsystem pump is capable of circulating fluid through the first fluid conduit loop,
a second fluid conduit loop capable of receiving fluid from the second cooling subsystem and returning fluid to the second fluid subsystem wherein the one or more channels of the thermal transfer unit are part of the second fluid conduit loop, wherein second cooling subsystem pump is capable of circulating fluid through the second fluid conduit loop, and
at least one first valve disposed in the first fluid conduit loop and at least one second valve disposed in the second fluid conduit loop, wherein the at least one first valve is capable of closing off the first cooling subsystem from the first fluid conduit loop and the at least one second valve is capable of closing off the second cooling subsystem from the second fluid conduit loop.

18. The heat management system of claim 17 wherein the first cooling subsystem heat dissipation unit comprises a plurality of fins.

19. The heat management system of claim 17 also comprising logic for switching between a first state of the heat management system wherein the first cooling subsystem is open to the first fluid conduit loop, a heat transfer fluid is circulating in the first fluid conduit loop, and the second cooling subsystem is closed to the second fluid conduit loop, and a second state of the heat management system wherein the second cooling subsystem is open to the second fluid conduit loop, a heat transfer fluid is circulating in the second fluid conduit loop, and the first cooling subsystem is closed to the second fluid conduit loop.

20. The heat management system of claim 19 wherein the logic switches between the first state and the second state of the heat management system based on the temperature of the processor.

21. The heat management system of claim 19 wherein the logic switches between the first state and the second state of the heat management system based on a temperature difference between the heat transfer fluid in the first cooling subsystem and the heat transfer fluid the second cooling subsystem that exceeds a pre-characterized threshold value.

22. The heat management system of claim 19 wherein the logic switches between the first state and the second state of the heat management system based on known characteristics of the processor.

* * * * *